(12) United States Patent
Lin et al.

(10) Patent No.: US 8,157,412 B2
(45) Date of Patent: Apr. 17, 2012

(54) LIGHT EMITTING DIODE SUBSTRATE ASSEMBLY

(75) Inventors: Shun-Tian Lin, Shulin (TW); Chao-Tung Chung, Shulin (TW)

(73) Assignee: Shin Zu Shing Co., Ltd., Shulin, Taipei Hsien (TW)

( * ) Notice: Subject to any disclaimer, the term of this patent is extended or adjusted under 35 U.S.C. 154(b) by 325 days.

(21) Appl. No.: 12/591,765

(22) Filed: Dec. 1, 2009

(65) Prior Publication Data

US 2011/0128731 A1   Jun. 2, 2011

(51) Int. Cl.
*F21V 7/00* (2006.01)
*F21V 9/16* (2006.01)
*F21V 13/10* (2006.01)

(52) U.S. Cl. .......... 362/241; 362/84; 362/235; 362/260; 362/800

(58) Field of Classification Search .......... 362/84, 362/241, 247, 800, 235, 260
See application file for complete search history.

(56) References Cited

U.S. PATENT DOCUMENTS

| | | | | |
|---|---|---|---|---|
| 4,742,432 A | * | 5/1988 | Thillays et al. | 361/783 |
| 4,935,665 A | * | 6/1990 | Murata | 313/500 |
| 5,632,551 A | * | 5/1997 | Roney et al. | 362/485 |
| 6,428,189 B1 | * | 8/2002 | Hochstein | 362/373 |
| 7,098,483 B2 | * | 8/2006 | Mazzochette et al. | 257/81 |
| 7,101,061 B2 | * | 9/2006 | Nagai et al. | 362/294 |
| 7,312,927 B2 | * | 12/2007 | Bogner et al. | 359/630 |
| 7,350,933 B2 | * | 4/2008 | Ng et al. | 362/84 |
| 7,414,269 B2 | * | 8/2008 | Grotsch et al. | 257/81 |
| 7,456,500 B2 | * | 11/2008 | Kromotis et al. | 257/725 |
| 8,052,296 B2 | * | 11/2011 | Kim et al. | 362/97.3 |
| 2007/0097683 A1 | * | 5/2007 | Chikugawa | 362/241 |

* cited by examiner

*Primary Examiner* — Alan Cariaso
(74) *Attorney, Agent, or Firm* — Bacon & Thomas, PLLC

(57) ABSTRACT

A light emitting diode substrate assembly has a metal substrate, a circuit board, multiple chip strings, an annular wall and an encapsulant. The circuit board is mounted on the top surface of the substrate and has multiple through holes and multiple current conducting lines. The chip strings are mounted on the substrate and respectively in the through hole in the circuit board. Each chip string has at least one light emitting diode chip connected electrically to two corresponding current conducting lines on the circuit board with bonding wires. Accordingly, the heat generating during the operation of the chips can be efficiently dissipated from the substrate.

32 Claims, 12 Drawing Sheets

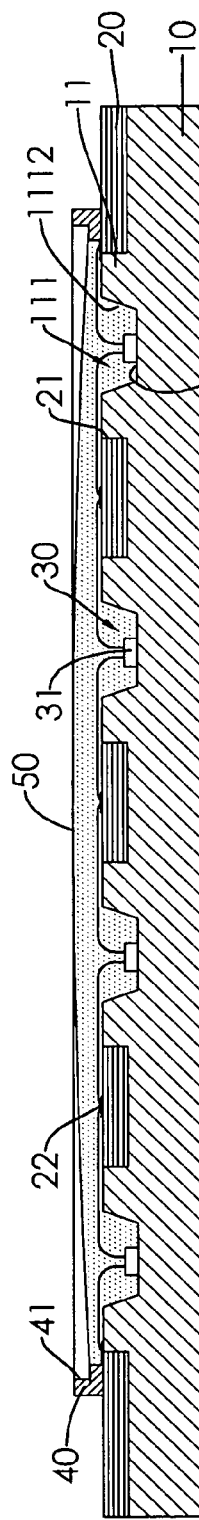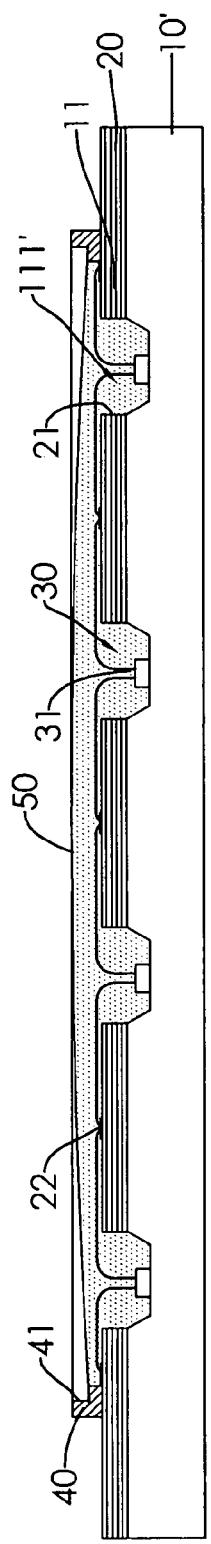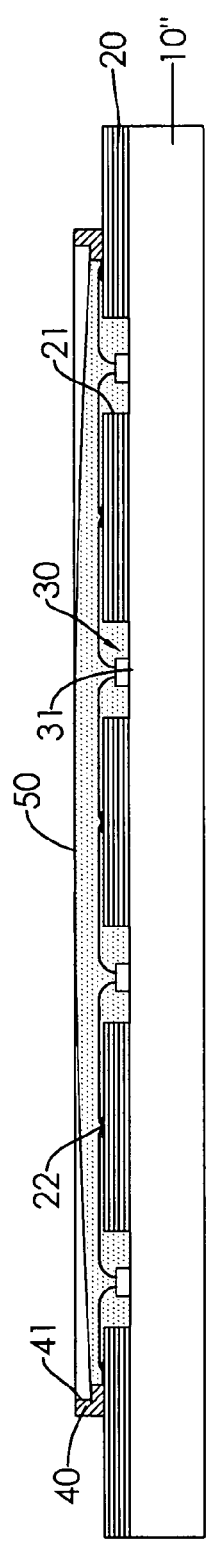

LIGHT EMITTING DIODE SUBSTRATE ASSEMBLY

BACKGROUND OF THE INVENTION

1. Field of the Invention

The present invention relates to a light emitting diode substrate assembly, and more particularly to a light emitting diode substrate assembly having multiple light emitting diodes chips mounted directly on a metal substrate.

2. Description of Related Art

A light emitting diode (LED) has capabilities of long useful life, low power-consuming, high brightness, small volume, quick reaction time and so on, the LED is popular and takes the place of the incandescent lamp and fluorescent to serve as a new generation of light source.

With reference to FIG. 12, a conventional LED (71) is mounted on one side of a printed circuit board (PCB) or a metal core printed circuit board (MCPCB) (72), and a heat-dissipating element (73) is mounted on the other side of the PCB (72). Alternatively the conventional LED (71) may be mounted on an aluminum substrate having a dielectric layer and a conductive layer. Accordingly, heat generating during the operation of the LED (71) can be dissipated by the heat-dissipating element (73) or the aluminum substrate through the PCB (72) or the dielectric layer.

However, the PCB or the MCPCB (72) is made of polymer materials and the dielectric layer is made of polymer or ceramic materials, so the heat-conducting capability of the PCB (72)/dielectric layer is low. Therefore, heat generating during the operation of the LED (71) is stored up in the PCB (72) or the dielectric layer, and the heat-dissipating effect to the LED (71) is not sufficient.

Additionally, when the PCB (72) has a thin substrate, the PCB (72) cannot be applied to a high voltage condition. Contrarily, when the PCB (72) has a thick substrate, the heat-conducting capability of the PCB (72) becomes reduced. Therefore, the conventional LED substrate assembly as shown in FIG. 12 cannot be applied for an alternating current (AC) LED.

With reference to FIG. 13A, in a chip on board (COB) technique, a substrate has a recess (81) and multiple direct current (DC) LED chips (82) are mounted in the recess (81) in an array. When packaging, the chips (82) are connected electrically with each other by bonding wires (83). However, when the number of the chips (82) is increasing, the chips (82) are difficulty positioned on precisely desired positions and easily misalign from each other. With the tiny size of electrodes on the chips (82), the wire-bonding process is easily misaligned. To solve the problem, an Optical Alignment System is applied during wire bonding. However, the effect does not meet expectation. Additionally, there is not a reflecting surface formed between the chips (82), lateral light emitting from the chips (82) cannot be efficiently reflected as a light source.

FIGS. 13B and C show LED chip arrays applied for AC LED. However, the LED chip array at most comprises two chips (84) due to the household voltage up to 220V, so the AC LED cannot have more than three chips as shown in FIG. 13A.

To overcome the shortcomings, the present invention tends to provide a light emitting diode substrate assembly to mitigate or obviate the aforementioned problems.

SUMMARY OF THE INVENTION

The main objective of the invention is to provide a light emitting diode substrate assembly that can provide an excellent heat-dissipating effect.

Another objective of the invention is to provide a light emitting diode substrate assembly that can prevent wire-misaligning during the wire-bonding process.

The further objective of the invention is to provide a light emitting diode substrate assembly having multiple AC LED chips connected in parallel for passing High Breakdown Voltage Test.

To achieve above objectives, the light emitting diode substrate assembly in accordance with the present invention has a metal substrate, a circuit board, multiple chip strings, an annular wall and an encapsulant. The metal substrate has a top surface and multiple reflecting cups. The reflecting cups are formed on the top surface of the substrate. Each reflecting cup has a top and a recess. The recess is defined in the top of the reflecting cup and has an opening, a bottom, an inner side wall and a diameter. The opening is defined in the top of the reflecting cup. The bottom is opposite to the opening. The inner side wall is formed as a reflecting surface. The diameter is gradually increasing from the bottom to the opening. The circuit board is mounted on the top surface of the substrate and has a top, multiple through holes and multiple current conducting lines. The through holes are defined through the circuit board and mounted respectively around the reflecting cups on the substrate. The current conducting lines are formed on the top of the circuit board. Each adjacent two of the through holes has one of the current conducting lines mounted between the adjacent through holes, and each through hole has at least two of the current conducting lines mounted adjacent to the through hole. The chip strings are mounted respectively in the reflecting cups, wherein each reflecting cup has at least one of the chip strings mounted in the reflecting cup. Each chip string has at least one light emitting diode chip mounted on the bottom of a corresponding one of the reflecting cup and connected electrically to two corresponding current conducting lines on the circuit board with bonding wires. The annular wall is mounted on the top of the circuit board around the through holes and has a holding space defined through the annular wall and enclosing the reflecting cups inside. The encapsulant with fluorescent powders is mounted in the holding space in the annular wall and encapsulating the chip strings.

In another embodiment, the light emitting diode substrate assembly in accordance with the present invention has a metal substrate, a circuit board, multiple chip strings, an annular wall and an encapsulant. The metal substrate has a top surface and multiple reflecting recesses. The reflecting recesses are defined in the top surface of the substrate. Each reflecting recess has a top, an opening, a bottom, an inner side wall and a diameter. The opening is defined in the top of the reflecting cup. The bottom is opposite to the opening. The inner side wall is formed as a reflecting surface. The diameter gradually increases from the bottom to the opening. The circuit board is mounted on the top surface of the substrate and has a top, multiple through holes and multiple current conducting lines. The through holes are defined through the circuit board and are mounted respectively around the reflecting recesses in the substrate. The current conducting lines are formed on the top of the circuit board. Each adjacent two of the through holes has one of the current conducting lines mounted between the adjacent through holes, and each through hole has at least two of the current conducting lines mounted adjacent to the through hole. The chip strings are mounted respectively in the reflecting recesses. Each reflecting recess has at least one of the chip strings mounted in the reflecting recess, and each chip string comprises at least one light emitting diode chip. The least one light emitting diode chip is mounted on the bottom of a corresponding one of the reflecting recesses and is connected electrically to two corresponding current conducting lines on the circuit board with bonding wires. The annular wall is mounted on the top of the circuit board around the through holes and has a holding space defined through the annular wall and enclosing the reflecting cups inside. The encapsulant with fluorescent powders is mounted in the holding space in the annular wall and encapsulating the chip strings.

In a further embodiment, the light emitting diode substrate assembly in accordance with the present invention has a metal substrate, a circuit board, multiple chip strings, an annular wall and an encapsulant. The metal substrate has a top surface. The circuit board is mounted on the top surface of the substrate and has a top, multiple through holes and multiple current conducting lines. The through holes are defined through the circuit board. The current conducting lines are formed on the top of the circuit board. Each adjacent two of the through holes has one of the current conducting lines mounted between the adjacent through holes and each through hole has at least two of the current conducting lines mounted adjacent to the through hole. The chip strings are mounted on the top surface of the substrate and are mounted respectively in the through holes in the circuit board. Each through hole has at least one of the chip strings mounted in the through hole, and each chip string comprises at least one light emitting diode chip. The at least one light emitting diode chip is mounted on the top surface of the substrate and is connected electrically to two corresponding current conducting lines on the circuit board with bonding wires. The annular wall is mounted on the top of the circuit board around the through holes and has a holding space defined through the annular wall and enclosing the reflecting cups inside. The encapsulant with fluorescent powders is mounted in the holding space in the annular wall and encapsulating the chip strings.

To form a substrate assembly in accordance with the present invention, a metal, such as steel, copper or alloy thereof can be formed as a substrate by hot forging, cold forging or metal powder injection molding process.

In an alternative embodiment, a metal, such as aluminum or aluminum alloy is formed as a substrate by hot forging, cold forging or metal powder injection molding or by extruding or casting process to form a semifinished product and then be applied with a machining process to a final substrate.

With such a substrate assembly in accordance with the present invention, the light emitting diode chips are mounted directly in the bottoms of the recesses in the reflecting cups on the substrate. The inner side walls of the recesses in the reflecting cups can serve as reflecting surfaces to reflect lateral light emitting from the chips. Thus, a concentrating effect is provided to the light emitting from the chips, such that the lightness provided by the light emitting diode substrate assembly is improved. The heat generating during the operation of the chips can be dissipated efficiently from the substrate, the heat-dissipating effect to the chips can be enhanced. Furthermore, with the arrangement of the current conducting lines, the wire bonding process applied to connect the chips and the current conducting lines with bonding wires will not be misaligned.

In addition, with the parallel connection between the chips with the current conducting lines, the chips can be alternating current (AC) LED chips activated by 110 or 220 Volt. Because the chips are mounted directly on the substrate, the thickness of the circuit board can be increased to load a high voltage alternating current, such as 3000 Volt, and the light emitting diode substrate assembly is versatile in use.

Other objects, advantages and novel features of the invention will become more apparent from the following detailed description when taken in conjunction with the accompanying drawings.

BRIEF DESCRIPTION OF THE DRAWINGS

FIG. 1A is a side view in partial section of a first embodiment of an LED substrate assembly in accordance with the present invention;

FIG. 1B is a side view in partial section of a second embodiment of an LED substrate assembly in accordance with the present invention;

FIG. 1C is a side view in partial section of a third embodiment of an LED substrate assembly in accordance with the present invention;

DETAILED DESCRIPTION OF PREFERRED EMBODIMENT

Figure 2:
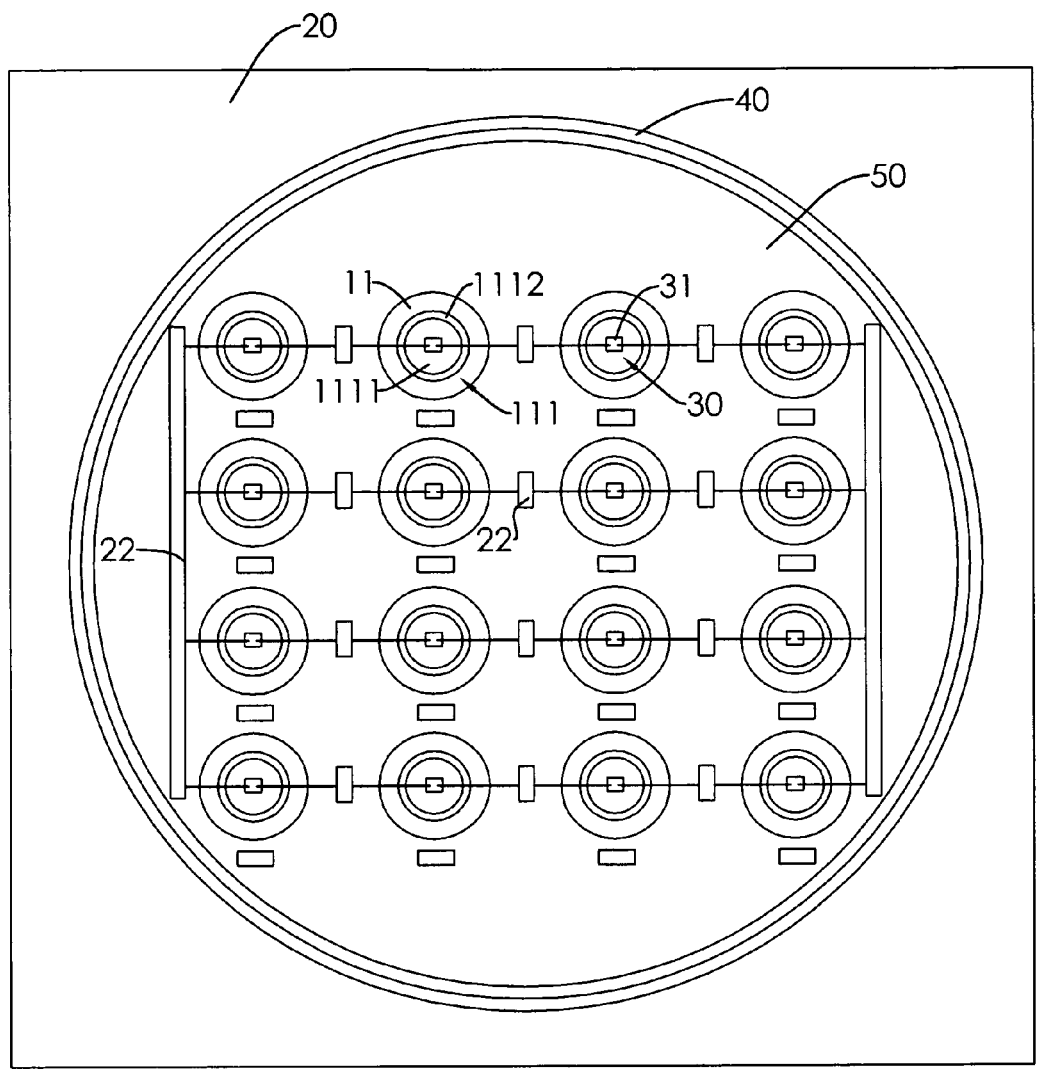
FIG. 2 is an enlarged top view of the LED substrate assembly in FIG. 1.

With reference to FIGS. 1A and 2, a light emitting diode substrate assembly comprises a substrate (10), a circuit board (20), multiple chip strings (30), an annular wall (40) and an encapsulant (50).

The substrate (10) is metal and has a top surface, a bottom surface and multiple reflecting cups (11). The bottom surface of the substrate (10) may be flat. The reflecting cups (11) are formed on and protrudes from the top surface of the substrate

(10) and each reflecting cup (11) has a top and a recess (111). The recess (111) is defined in the top of the reflecting cup (11) and has an opening, a bottom (1111), an inner side wall (1112) and a diameter. The opening is defined in the top of the reflecting cup (11), and the bottom (1111) is opposite to the opening. The inner side wall (1112) is formed as a reflecting surface by electroplating a metal layer onto the inner side wall (1112), wherein the metal layer may be made of a metal having a high reflective index such as nickel, aluminum or silver. The recess (111) may be truncated cylindrical cone in shape to make diameter of the recess (111) gradually increasing from the bottom (1111) to the opening for improving the reflection efficiency.

The circuit board (20) is mounted on the top surface of the substrate (10) and has a top, multiple through holes (21) and multiple current conducting lines (22). The through holes (21) are defined through the circuit board (20) and are mounted respectively around the reflecting cups (11) on the substrate (10). The current conducting lines (22) are formed on the top of the circuit board (20). Each adjacent two of the through holes (21) has one of the current conducting lines (22) mounted between the adjacent through holes (21), and each through hole (21) has at least two of the current conducting lines (22) mounted adjacent to the through hole (21).

The chip strings (30) are mounted respectively in the reflecting cups (11), wherein each reflecting cup (11) has at least one of the chip strings (30) mounted in the reflecting cup (11). In the first embodiment, sixteen reflecting cups (11) are implemented and are arranged in a 4×4 array, and sixteen chip strings (30) are mounted respectively in the reflecting cups (11). Each chip string (30) comprises at least one light emitting diode chip (31) mounted on the bottom (1111) of the recess (111) in a corresponding one of the reflecting cups (11) and connected electrically to two corresponding current conducting lines (22) on the circuit board (20) with a wire bonding technique.

Figure 3A:
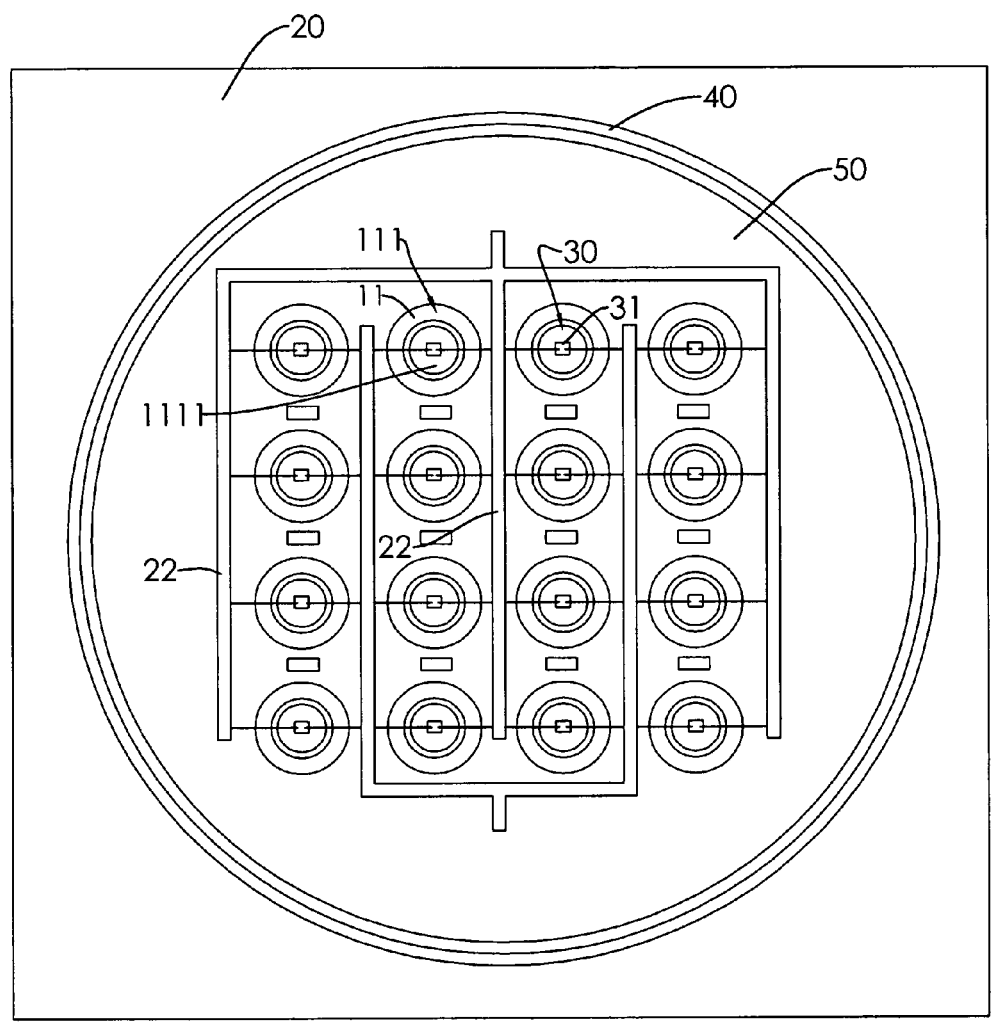
FIG. 3A is an enlarged top view of a fourth embodiment of an LED substrate assembly in accordance with the present invention.
Figure 3B:
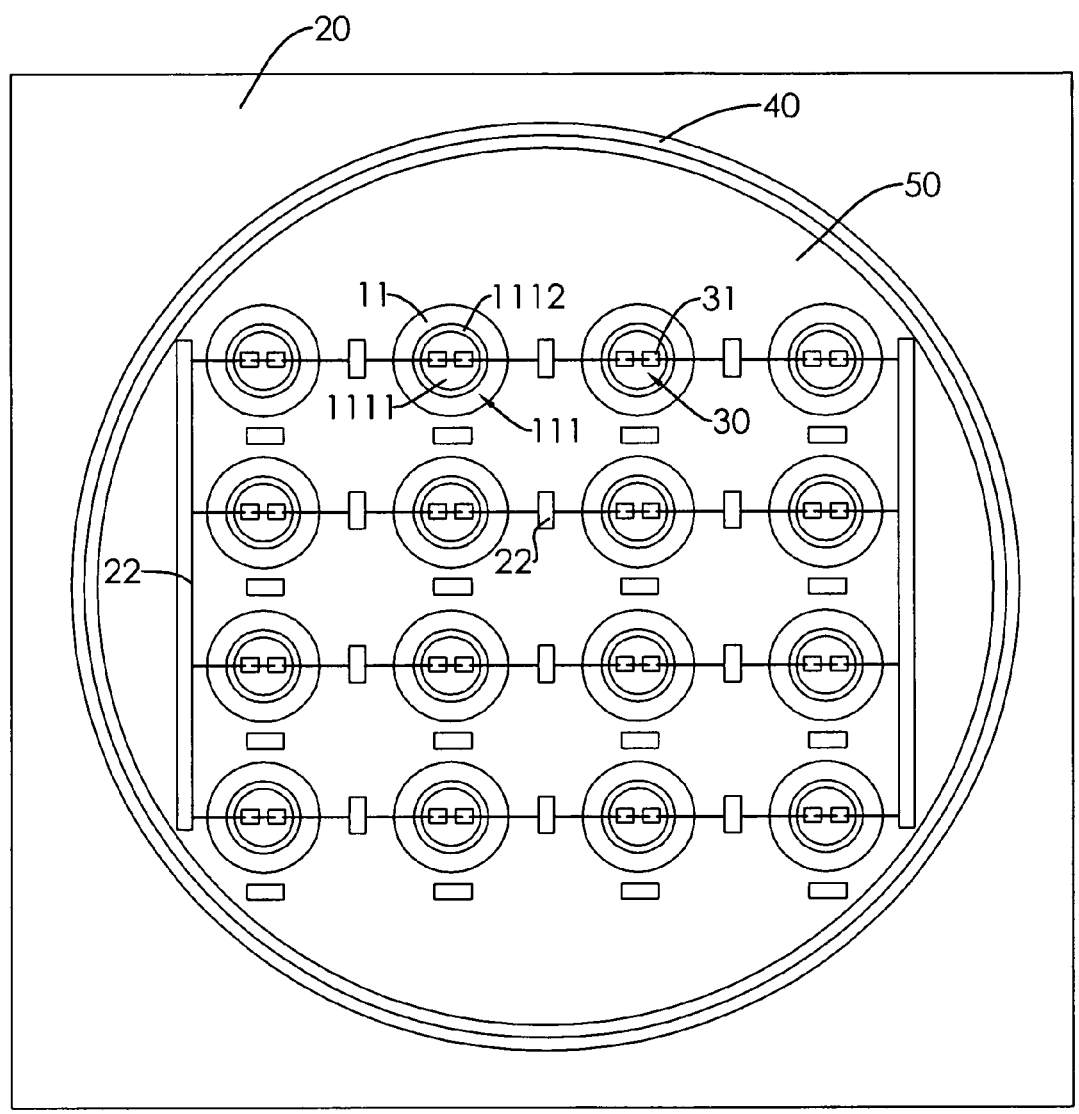
FIG. 3B is an enlarged top view of a fifth embodiment of an LED substrate assembly in accordance with the present invention.
Figure 4:
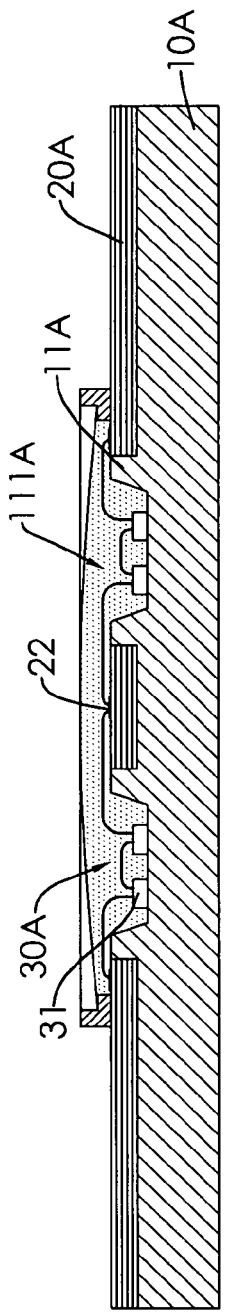
FIG. 4 is a side view in partial section of a sixth embodiment of an LED substrate assembly in accordance with the present invention.

In the embodiments shown in FIGS. 3B and 4, each chip string (30,30A) has multiple light emitting diode chips (31, 31A) connected with each other in series. Because at least two current conducting lines (22) are mounted adjacent to each through hole (21), the light emitting diode chips (31,31A) can be coupled to the current conducting lines (22) in series or parallel based on different needs. In the embodiments as shown in FIGS. 1, 2 and 3B, the light emitting diode chips (31,31A) in a same row of the array are connected with each other in series and in different rows are connected with each other in parallel by the current conducting lines (22). In the embodiment shown in FIG. 3A, the light emitting diode chips (31) in a same column of the array are connected with each other in parallel by the current conducting lines (22). The current conducting lines (22) can be formed in any suitable shape or size for the convenience during wire bonding in order to improve productivity.

The annular wall (40) may be aluminum, ceramic or plastic and is mounted on the top of the circuit board (20), is mounted around the through holes (21) and has a holding space (41) defined though the annular wall (40) and enclosing the reflecting cups (11) inside.

The encapsulant (50) with fluorescent powders is mounted and filled in the holding space (41) in the annular wall (40) and encapsulates the chip strings (30,30A).

With such an arrangement, the light emitting diode chips (30,30A) are mounted directly in the bottoms (1111) of the recesses (111) in the reflecting cups (11) on the substrate (10). The inner side walls (1112) of the recesses (111) in the reflecting cups (11) can serve as reflecting surfaces to reflect lateral light emitting from the chips (31,31A). Thus, a concentrating effect is provided to the light emitting from the chips (31,31A), such that the lightness provided by the light emitting diode substrate assembly is improved.

Because the chips (31,31A) are mounted respectively in the recesses (111) in the reflecting cups (11), arranged in an array and connected electrically with each other by bonding wires and the current conducting lines (22), the wire bonding process applied to connect the chips (31,31A) and the current conducting lines (22) with bonding wires will not be misaligned.

In addition, the heat generating during the operation of the chips (31,31A) can be dissipated efficiently from the substrate (10), the heat-dissipating effect to the chips (31,31A) can be enhanced. With the parallel connection between the chips (31,31A) with the current conducting lines (22), the chips (31,31A) can be alternating current (AC) LED chips activated by 110 or 220 Volt. Because the chips (31,31A) are mounted directly on the substrate (10), the increase of the thickness of the circuit board (20) will not influence the heat-dissipating effect to the chips (31,31A). Therefore, the thickness of the circuit board (20) can be increased to load a high voltage alternating current, such as 3000 Volt, and the light emitting diode substrate assembly is versatile in use.

Figure 5:
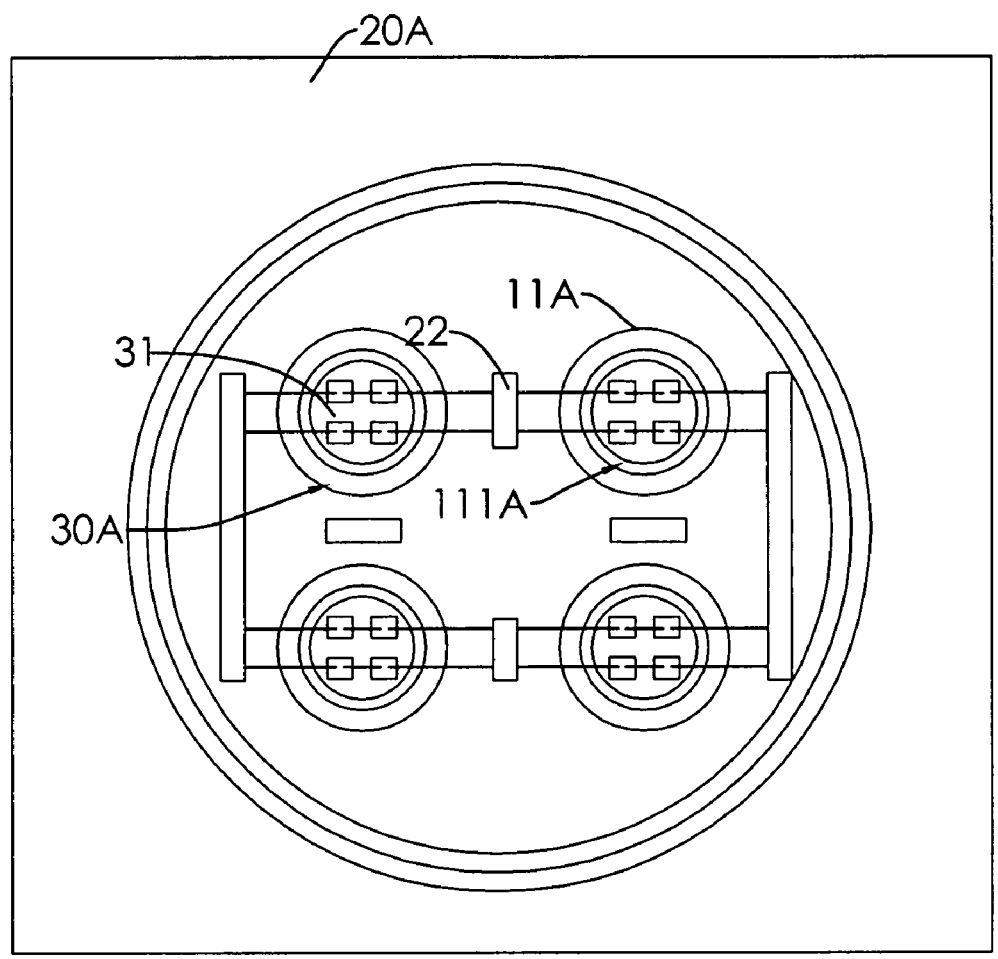
FIG. 5 is an enlarged top view of the LED substrate assembly in FIG. 4.

With reference to FIGS. 4 and 5, in the sixth embodiment, each reflecting cup (11A) has multiple chip strings (30A), and each chip string (30A) has multiple light emitting diode chips (31,31A) connected with each other in series. The chips (31, 31A) of the chip strings (30A) in a same reflecting cup (11A) are connected in parallel with the current conducting lines (22) on the circuit board (20A) adjacent to the reflecting cup (11A). In this preferred embodiment as shown, four reflecting cups (11A) are implemented and arranged in a 2×2 array on the substrate (10A). Two chip strings (30A) are mounted in each reflecting cup (11A), and each chip string (30A) has two chips (31,31A) connected with each other in series.

Figure 6:
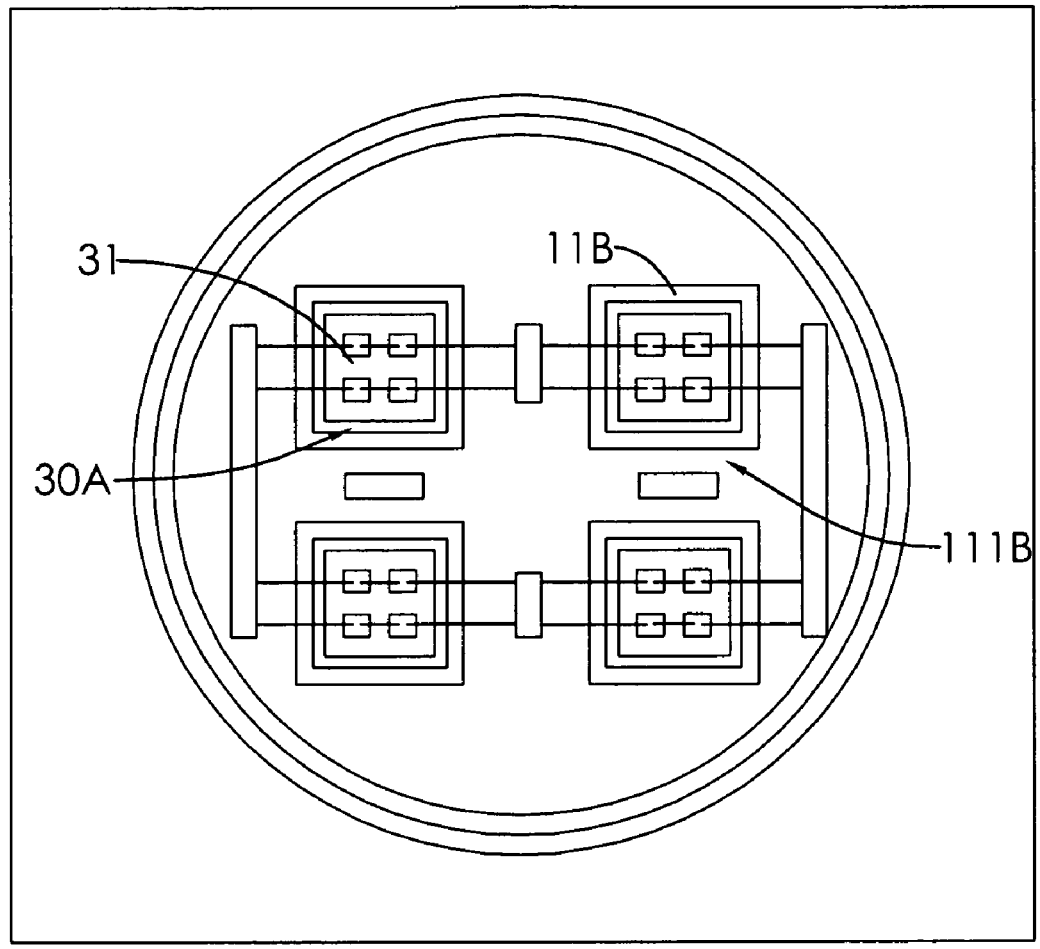
FIG. 6 is an enlarged top view of a seventh embodiment of an LED substrate assembly in accordance with the present invention.

With reference to FIG. 6, the recess (111B) of each reflecting cap (11B) is truncated cubic cone in shape.

Figure 7:
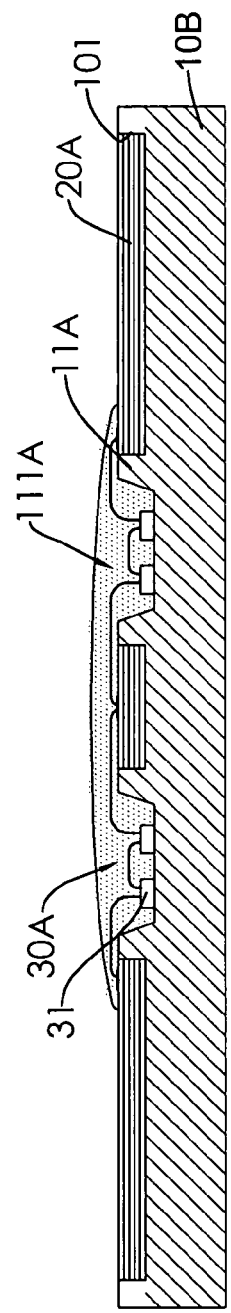
FIG. 7 is a side view in partial section of an eighth embodiment of an LED substrate assembly in accordance with the present invention.

With reference to FIG. 7, the substrate (10B) may further have a cavity (101) defined in the top surface of the substrate (10B), and the circuit board (20A) is mounted in the cavity (101). With the arrangement of the cavity (101), the positioning effect to the circuit board (20A) on the substrate (10B) can be improved.

Figure 8:
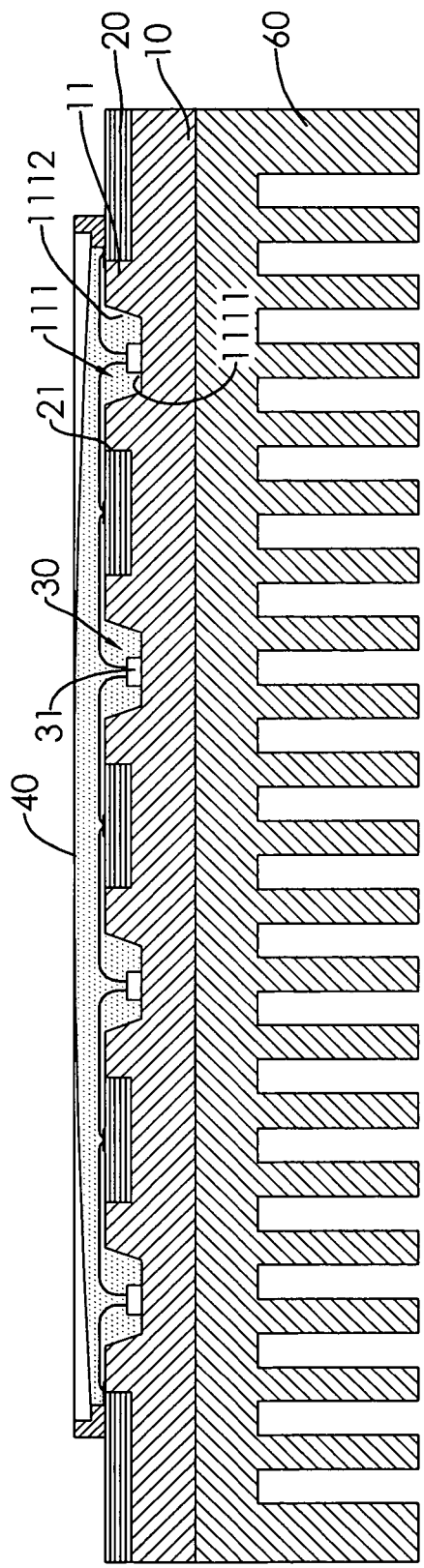
FIG. 8 is a side view in partial section of a ninth embodiment of an LED substrate assembly in accordance with the present invention.
Figure 9:
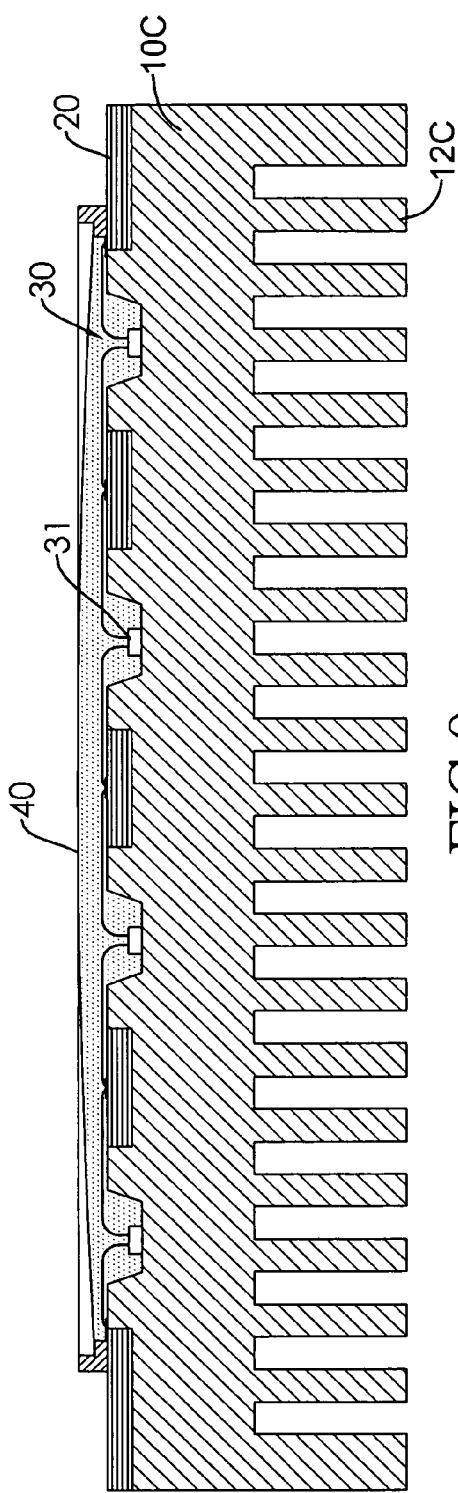
FIG. 9 is a side view in partial section of a tenth embodiment of an LED substrate assembly in accordance with the present invention.
Figure 10:
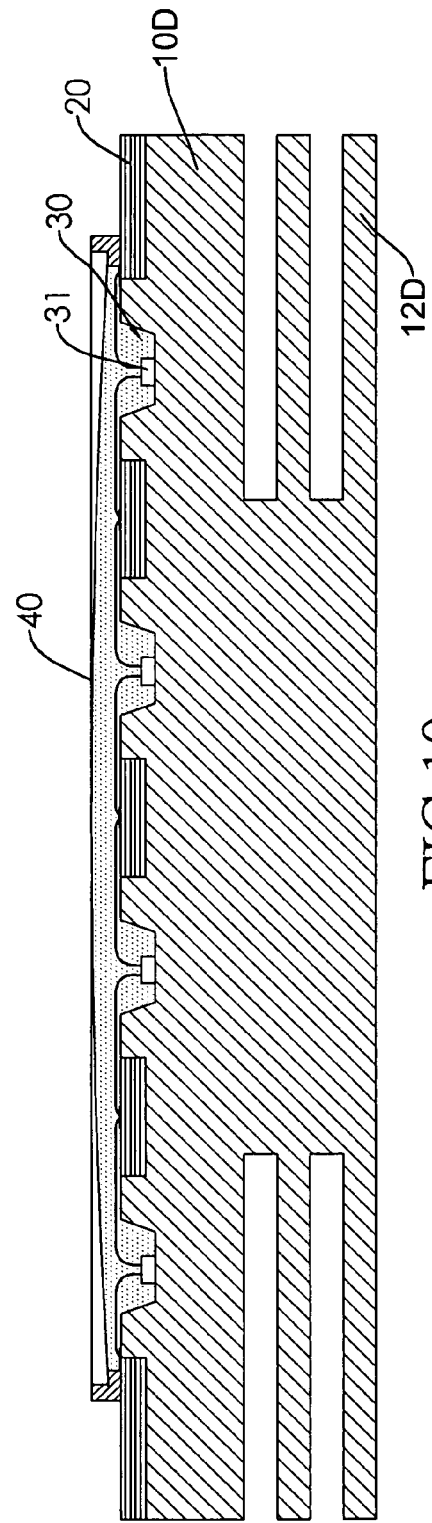
FIG. 10 is a side view in partial section of an eleventh embodiment of an LED substrate assembly in accordance with the present invention.

With reference to FIG. 8, the substrate (10) has a bottom surface and a heat-dissipating element having multiple fins (60) is mounted on the bottom surface of the substrate (10). With reference to FIG. 9, multiple fins (12C) are integrally formed on and perpendicularly protrude from the bottom surface of the substrate (10C). With reference to FIG. 10, multiple fins (12D) are integrally formed on and laterally protrude from the bottom surface of the substrate (10D). With the fins (60,12C,12D), the heat-dissipating effect of the substrate (10,10C,10D) can be improved.

Figure 11:
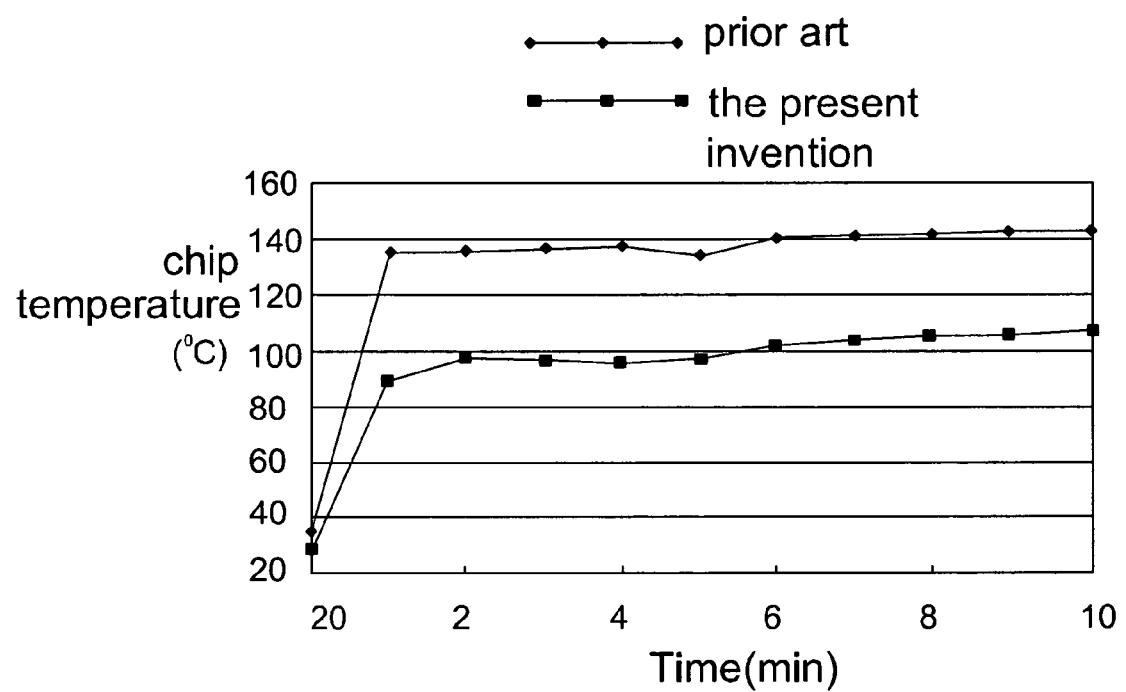
FIG. 11 is a chart showing temperature-time of the LED substrate assembly as shown in FIG. 8 and a conventional LED assembly in accordance with the prior art.
Figure 12:
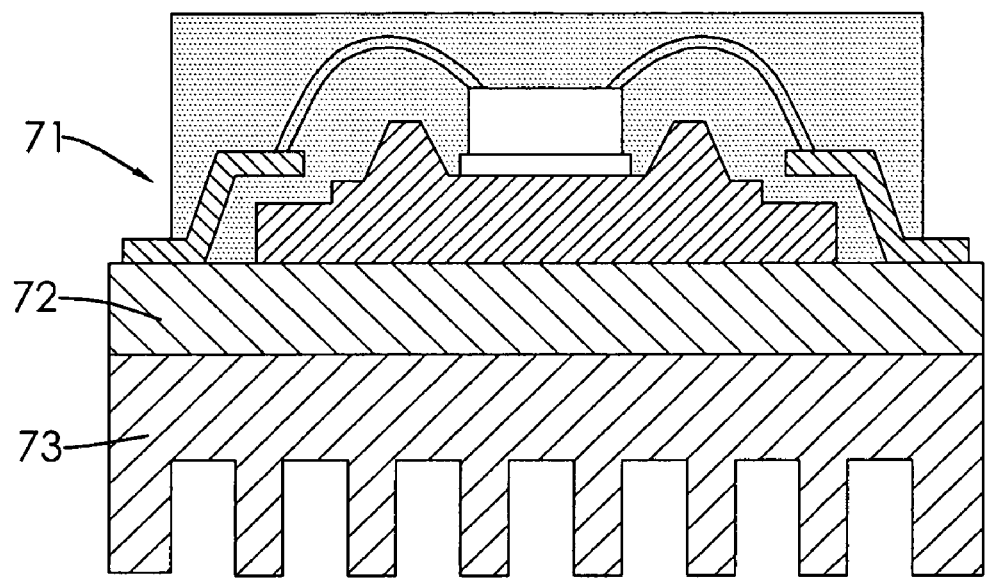
FIG. 12 is a side view in partial section of an LED substrate assembly in accordance with the prior art.
Figure 13A:
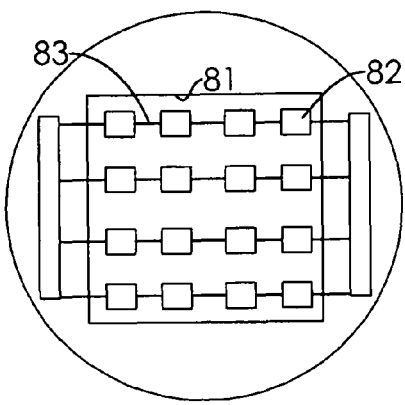
FIG. 13A is a top view of a chip on board DC LED assembly in accordance with the prior art.
Figure 13B:
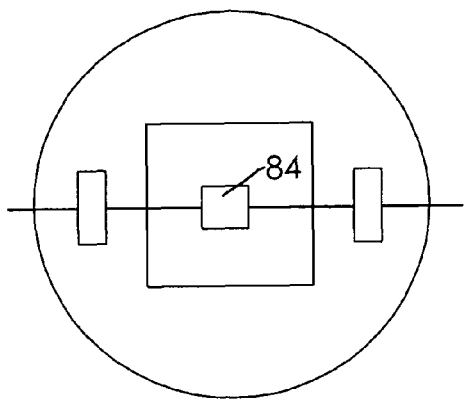
FIG. 13B is a top view of a chip on board AC LED assembly in accordance with the prior art.
Figure 13C:
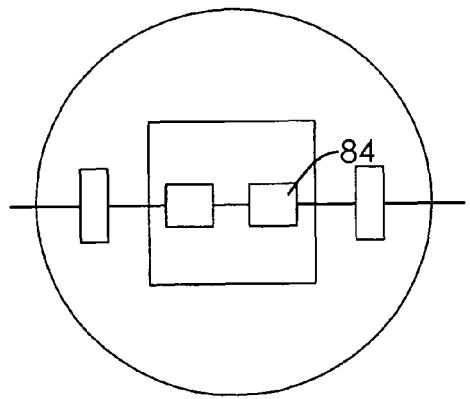
FIG. 13C is a top view of another chip on board AC LED assembly in accordance with the prior art.

With reference to FIG. 11, the heat-dissipating effect of the light emitting diode substrate assembly is better than that of a conventional one at same conditions. The temperature of the chips (31,31A) can be efficiently lowered due to the structural arrangement in accordance with the present invention.

With reference to FIG. 1B, the second embodiment in accordance with the present invention has a structure similar to that of the first embodiment except that multiple reflecting recesses (111') are defined in the top surface of the metal substrate (10'). Each reflecting recess (111') has a bottom, and the chips (31) of the chip strings (30) are mounted respectively on the bottoms of the reflecting recesses (111'). Each reflecting recess (111') has an inner side wall formed as a reflecting surface by electroplating metal thereon.

With reference to FIG. 1C, the third embodiment in accordance with the present invention has a structure similar to that of the second embodiment except that the substrate (10") has a flat top surface and the chip strings (30) are mounted on the top surface of the substrate (10") and mounted respectively in the through holes (21) in the circuit board (20). The substrate (10") may further have multiple reflecting surfaces formed on the top surface of the substrate (10") at positions corresponding to and mounted in the through holes (21) in the circuit board (20) by electroplating metal thereon.

To form a substrate (10,10',10",10A,10B,10C,10D) in accordance with the present invention, a metal, such as steel, copper or alloy thereof can be formed as a substrate (10,10', 10",10A,10B,10C,10D) by hot forging, cold forging or metal powder injection molding process. Alternatively, a metal, such as aluminum or aluminum alloy can be formed as a substrate (10,10',10",10A,10B,10C,10D) by hot forging, cold forging or metal powder injection molding or by extruding or casting process to form a semifinished product and then be applied with a machining process to a final substrate (10, 10',10",10A,10B,10C,10D).

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode substrate assembly comprising:
   a metal substrate having
      a top surface; and
      multiple reflecting cups formed on the top surface of the substrate and each reflecting cup having
         a top; and
         a recess defined in the top of the reflecting cup and having an opening defined in the top of the reflecting cup, a bottom opposite to the opening, an inner side wall to form as a reflecting surface and a diameter gradually increasing from the bottom to the opening;
   a circuit board mounted on the top surface of the substrate and having
      a top;
      multiple through holes defined through the circuit board and mounted respectively around the reflecting cups on the substrate; and
      multiple current conducting lines formed on the top of the circuit board, wherein each adjacent two of the through holes has one of the current conducting lines mounted between the adjacent through holes and each through hole has at least two of the current conducting lines mounted adjacent to the through hole;
   multiple chip strings mounted respectively in the reflecting cups, wherein each reflecting cup has at least one of the chip strings mounted in the reflecting cup and each chip string comprises
      at least one light emitting diode chip mounted on the bottom of the recess in a corresponding one of the reflecting cups and connected electrically to two corresponding current conducting lines on the circuit board with bonding wires;
   an annular wall mounted on the top of the circuit board around the through holes and having a holding space defined through the annular wall and enclosing the reflecting cups inside; and
   an encapsulant with fluorescent powders mounted in the holding space in the annular wall and encapsulating the chip strings.

2. The light emitting diode substrate assembly as claimed in claim 1, wherein the reflecting cups on the substrate are arranged in an array.

3. The light emitting diode substrate assembly as claimed in claim 1, wherein each chip string has multiple light emitting diode chips connected with each other in series.

4. The light emitting diode substrate assembly as claimed in claim 1, wherein the recess of each reflecting cap is truncated cylindrical cone in shape.

5. The light emitting diode substrate assembly as claimed in claim 1, wherein the recess of each reflecting cap is truncated cubic cone in shape.

6. The light emitting diode substrate assembly as claimed in claim 1, wherein the substrate has a bottom surface and multiple fins formed on and protruding from the bottom surface of the substrate.

7. The light emitting diode substrate assembly as claimed in claim 1, wherein the substrate has a flat bottom surface.

8. The light emitting diode substrate assembly as claimed in claim 1, wherein the substrate further has a cavity defined in the top surface of the substrate; and
   the circuit board is mounted in the cavity.

9. The light emitting diode substrate assembly as claimed in claim 1, wherein the reflecting surface is made of a metal having a high reflective index.

10. The light emitting diode substrate assembly as claimed in claim 9, wherein the metal is selected from nickel, aluminum and silver.

11. A light emitting diode substrate assembly comprising:
    a metal substrate having
       a top surface; and
       multiple reflecting recesses defined in the top surface of the substrate and each reflecting recess having
          a top;
          an opening defined in the top of the reflecting cup;
          a bottom opposite to the opening,
          an inner side wall to form as a reflecting surface; and
          a diameter gradually increasing from the bottom to the opening;
    a circuit board mounted on the top surface of the substrate and having
       a top;
       multiple through holes defined through the circuit board and mounted respectively around the reflecting recesses in the substrate; and
       multiple current conducting lines formed on the top of the circuit board, wherein each adjacent two of the through holes has one of the current conducting lines mounted between the adjacent through holes and each through hole has at least two of the current conducting lines mounted adjacent to the through hole;
    multiple chip strings mounted respectively in the reflecting recesses, wherein each reflecting recess has at least one of the chip strings mounted in the reflecting recess and each chip string comprises
       at least one light emitting diode chip mounted on the bottom of a corresponding one of the reflecting recesses and connected electrically to two corresponding current conducting lines on the circuit board with bonding wires;

an annular wall mounted on the top of the circuit board around the through holes and having a holding space defined through the annular wall and enclosing the reflecting cups inside; and an encapsulant with fluorescent powders mounted in the holding space in the annular wall and encapsulating the chip strings.

12. The light emitting diode substrate assembly as claimed in claim 11, wherein the reflecting recesses in the substrate are arranged in an array.

13. The light emitting diode substrate assembly as claimed in claim 11, wherein each chip string has multiple light emitting diode chips connected with each other in series.

14. The light emitting diode substrate assembly as claimed in claim 11, wherein each reflecting recess is truncated cylindrical cone in shape.

15. The light emitting diode substrate assembly as claimed in claim 11, wherein each reflecting recess is truncated cubic cone in shape.

16. The light emitting diode substrate assembly as claimed in claim 11, wherein the substrate has a bottom surface and multiple fins formed on and protruding from the bottom surface of the substrate.

17. The light emitting diode substrate assembly as claimed in claim 11, wherein the substrate has a flat bottom surface.

18. The light emitting diode substrate assembly as claimed in claim 11, wherein the substrate further has a cavity defined in the top surface of the substrate; and the circuit board is mounted in the cavity.

19. The light emitting diode substrate assembly as claimed in claim 11, wherein the reflecting surface is made of a metal having a high reflective index.

20. The light emitting diode substrate assembly as claimed in claim 19, wherein the metal is selected from nickel, aluminum and silver.

21. A light emitting diode substrate assembly comprising:
a metal substrate having a top surface;
a circuit board mounted on the top surface of the substrate and having
    a top;
    multiple through holes defined through the circuit board; and
    multiple current conducting lines formed on the top of the circuit board, wherein each adjacent two of the through holes has one of the current conducting lines mounted between the adjacent through holes and each through hole has at least two of the current conducting lines mounted adjacent to the through hole;
multiple chip strings mounted on the top surface of the substrate and mounted respectively in the through holes in the circuit board, wherein each through hole has at least one of the chip strings mounted in the through hole and each chip string comprises
    at least one light emitting diode chip mounted on the top surface of the substrate and connected electrically to two corresponding current conducting lines on the circuit board with bonding wires;
an annular wall mounted on the top of the circuit board around the through holes and having a holding space defined through the annular wall and enclosing the reflecting cups inside; and
an encapsulant with fluorescent powders mounted in the holding space in the annular wall and encapsulating the chip strings.

22. The light emitting diode substrate assembly as claimed in claim 21, wherein the reflecting recesses in the substrate are arranged in an array.

23. The light emitting diode substrate assembly as claimed in claim 21, wherein each chip string has multiple light emitting diode chips connected with each other in series.

24. The light emitting diode substrate assembly as claimed in claim 21, wherein each reflecting recess is truncated cylindrical cone in shape.

25. The light emitting diode substrate assembly as claimed in claim 21, wherein each reflecting recess is truncated cubic cone in shape.

26. The light emitting diode substrate assembly as claimed in claim 21, wherein the substrate has a bottom surface and multiple fins formed on and protruding from the bottom surface of the substrate.

27. The light emitting diode substrate assembly as claimed in claim 21, wherein the substrate has a flat bottom surface.

28. The light emitting diode substrate assembly as claimed in claim 21, wherein the substrate further has a cavity defined in the top surface of the substrate; and the circuit board is mounted in the cavity.

29. A method for forming a metal substrate for a light emitting diode substrate assembly as claimed in claim 1 comprising an act of forming the metal substrate by a material selected from copper or alloy of copper.

30. The method as claimed in claim 29, wherein the metal substrate is formed by hot forging, cold forging or metal powder injection molding process.

31. A method for forming a metal substrate for a light emitting diode substrate assembly as claimed in claim 1 comprising an act of forming the metal substrate by a material selected from aluminum or aluminum alloy.

32. The method as claimed in claim 31, wherein the metal substrate is formed by hot forging, cold forging or metal powder injection molding or by extruding or casting process to form a semifinished product and is then applied with a machining process to a final substrate.

* * * * *